(12) United States Patent
Miao et al.

(10) Patent No.: US 12,078,693 B1
(45) Date of Patent: Sep. 3, 2024

(54) SYSTEM BASED ON READOUT OF MICROWAVE RESONANT CIRCUIT

(71) Applicant: Purple Mountain Observatory, Chinese Academy of Sciences, Nanjing (CN)

(72) Inventors: Wei Miao, Nanjing (CN); Shengcai Shi, Nanjing (CN); Jing Li, Nanjing (CN); Zhenhui Lin, Nanjing (CN); Feiming Li, Nanjing (CN); Qianghui Luo, Nanjing (CN)

(73) Assignee: Purple Mountain Observatory, Chinese Academy of Sciences, Nanjing (CN)

( * ) Notice: Subject to any disclaimer, the term of this patent is extended or adjusted under 35 U.S.C. 154(b) by 0 days.

(21) Appl. No.: 18/562,342

(22) PCT Filed: Feb. 28, 2023

(86) PCT No.: PCT/CN2023/078613
§ 371 (c)(1),
(2) Date: Nov. 20, 2023

(87) PCT Pub. No.: WO2023/216681
PCT Pub. Date: Nov. 16, 2023

(30) Foreign Application Priority Data

May 13, 2022 (CN) .......................... 202210519718.6

(51) Int. Cl.
*G01R 33/32* (2006.01)
*G01R 33/035* (2006.01)
(Continued)

(52) U.S. Cl.
CPC ....... *G01R 33/0354* (2013.01); *G01R 33/323* (2013.01); *H10N 60/12* (2023.02); *H10N 60/805* (2023.02)

(58) Field of Classification Search
CPC .. G01R 33/0354; G01R 33/323; G01R 33/00; G01R 33/0035; G01R 33/0023;
(Continued)

(56) References Cited

U.S. PATENT DOCUMENTS

| 2011/0012619 | A1 | 1/2011 | Ketchen et al. |
| 2015/0372159 | A1 | 12/2015 | Englund et al. |

(Continued)

FOREIGN PATENT DOCUMENTS

| CN | 102473844 A | 5/2012 |
| CN | 205139317 U | 4/2016 |

(Continued)

*Primary Examiner* — Jermele M Hollington
*Assistant Examiner* — Taqi R Nasir
(74) *Attorney, Agent, or Firm* — Bayramoglu Law Offices LLC

(57) ABSTRACT

A terahertz graphene Josephson junction detection system based on readout of a microwave resonant circuit includes a graphene Josephson junction detector, a microwave resonant readout circuit, and a microwave network analyzer. The graphene Josephson junction detector and the microwave resonant readout circuit form a microwave resonant circuit. A terahertz signal causes a change of an equivalent microwave inductance of the graphene Josephson junction detector, such that a resonant frequency and a quality factor of the microwave resonant circuit are changed. The present disclosure monitors the resonant frequency and the quality factor of the microwave resonant circuit with the microwave network analyzer, thereby realizing high-sensitivity detection on the terahertz signal. Compared with conventional direct-current (DC)-biased readout, readout of the microwave resonant circuit is not interfered by an external magnetic field, and has a strong interference resistance.

4 Claims, 2 Drawing Sheets

(51) Int. Cl.
*H10N 60/12* (2023.01)
*H10N 60/80* (2023.01)

(58) Field of Classification Search
CPC ............ G01R 33/0017; G01R 31/3191; H10N 60/12; G01B 7/004; G01C 17/38
See application file for complete search history.

(56) References Cited

U.S. PATENT DOCUMENTS

| | | | |
|---|---|---|---|
| 2017/0092834 A1 | 3/2017 | Fong et al. | |
| 2018/0337324 A1* | 11/2018 | Fong | ................. G01J 5/20 |
| 2020/0274507 A1* | 8/2020 | Fong | ................. H10N 60/128 |
| 2021/0311101 A1* | 10/2021 | Katti | ................. G01J 5/0853 |

FOREIGN PATENT DOCUMENTS

| | | | | |
|---|---|---|---|---|
| CN | 109489810 A | | 3/2019 | |
| CN | 110763333 A | | 2/2020 | |
| CN | 115265769 A | * 11/2022 | | ............ G01J 1/42 |
| CN | 115265769 A | | 11/2022 | |
| JP | 2011233825 A | | 11/2011 | |
| WO | 2008063100 A1 | | 5/2008 | |

* cited by examiner

SYSTEM BASED ON READOUT OF MICROWAVE RESONANT CIRCUIT

CROSS REFERENCE TO THE RELATED APPLICATIONS

This application is the national phase entry of International Application No. PCT/CN2023/078613, filed on Feb. 28, 2023, which is based upon and claims priority to Chinese Patent Application No. 202210519718.6, filed on May 13, 2022, the entire contents of which are incorporated herein by reference.

TECHNICAL FIELD

The present disclosure belongs to the technical field of terahertz detection, and in particular to a terahertz graphene Josephson junction detection system based on readout of a microwave resonant circuit.

BACKGROUND

Terahertz band is a novel electromagnetic band to be researched and developed comprehensively. With strong molecular absorption and dispersion, high spatial resolution, low photon energy, and the like, the terahertz band has an important scientific significance and a broad application prospect in astronomy, physics, material science, life science, information technology, etc. The high-sensitivity non-coherent detector is one of the key technologies in the development of terahertz science and application. At present, concerning the terahertz high-sensitivity non-coherent detector technology, there are mainly a superconducting transition edge sensor (TES) and a superconducting dynamic inductance detector. The superconducting TES pertains to a thermal detector. In recent years, owing to advances in a low-noise superconducting quantum interference device (SQUID) readout multiplexing technology and further clarifications on a detector noise mechanism, the superconducting TES has gained rapid development, and applied to many terahertz telescopes (such as a James Clerk Maxwell telescope (JCMT) in US). The superconducting dynamic inductance detector stimulates a quasi-particle photoelectric effect based on high-energy photons and employs a simpler frequency-domain readout multiplexing technology. It has a similar sensitivity as the superconducting TES and realizes preliminary test observation on many terahertz telescopes (such as an IRAM telescope in Europe).

Recently, another emerging terahertz high-sensitivity non-coherent detector, namely a graphene Josephson junction detector, has received widespread attention from researchers at home and abroad. Graphene is a single-layer sheet structure with carbon atoms forming hexagonal honeycomb lattices through a sp2 hybridized orbital. For the special carbon atomic single-layer structure, graphene has many unique physical characteristics. For example, it features a small electronic heat capacity and a weak electron-phonon interaction at a low temperature. Based on these features, the graphene is considered as one of the best materials to research the high-sensitivity non-coherent detector. The graphene Josephson junction detector mainly includes a micro-nano graphene microbridge and a superconducting electrode, and works based on the fact that Andreev reflections on interfaces between the superconducting electrode and the graphene microbridge (S-N) cause superconducting weak connection in the graphene microbridge. The superconducting weak connection in the graphene microbridge is closely associated with an electron temperature of the graphene microbridge. Due to the small electronic heat capacity and the weak electron-phonon interaction of the graphene at the low temperature, under the radiation of terahertz signals, the electron temperature in the graphene microbridge is increased dramatically. As a consequence, the superconducting weak connection in the graphene microbridge experiences a rapid change to realize high-sensitivity detection on the terahertz signals. Generally, the graphene Josephson junction detector achieves the background limit detection sensitivity. In addition to the high sensitivity, the graphene Josephson junction detector further features a wide working temperature range and a relatively simple structure (for example, compared with the leg-supported superconducting TES).

The graphene Josephson junction detector uses direct-current (DC)-biased readout, namely the graphene Josephson junction detector is biased at a constant current or a constant voltage. By reading a current or voltage of the graphene Josephson junction detector caused by the radiation of the terahertz signals, high-sensitivity detection on the terahertz signals is realized. Concerning the DC-biased readout, a DC readout noise must be lower than an intrinsic noise (including a thermal fluctuation noise, a shot noise, etc.) of the graphene Josephson junction detector. Till now, DC-biased readout technologies that can meet this condition are insufficient, and only the low-noise SQUID readout technology does. The SQUID is a mature magnetic flux detector with an ultra-high sensitivity and can detect a magnetic field and other physical quantities capable of being converted into a magnetic flux, such as a current and the voltage. In the graphene Josephson junction detector based on the SQUID readout, the SQUID reads a current or voltage of the graphene Josephson junction detector caused by radiation of terahertz signals to realize high-sensitivity detection on the terahertz signals. However, the SQUID readout is also restricted for some problems. The SQUID readout is dominated by a SQUID chip including a single Josephson junction or a plurality of Josephson junctions. The preparation process of the complex SQUID chip is highly demanding. Throughout the world, there are only several companies (such as the STAR Cryoelectronics in US) that can prepare the high-performance SQUID chip. A large-scale array detector is envisioned as one of the future development trends for the graphene Josephson junction detector. However, it is tricky to read the large-scale graphene Josephson junction array detector with the complex SQUID readout. This greatly restricts the development of the large-scale graphene Josephson junction array detector. The essence of the SQUID readout is the magnetic flux detector, which is very sensitive to an external magnetic field (such as a geomagnetic field). In the graphene Josephson junction detector based on the SQUID readout, an additional magnetic shielding device is further required, and the low-temperature magnetic shielding is hardly realized per se. The SQUID readout as DC readout needs an additional low-noise DC biased source. Meanwhile, noises such as a low-frequency 1/f noise in the SQUID readout will deteriorate the sensitivity of the graphene Josephson junction detector. In short, the SQUID readout cannot meet the application requirements of the high-sensitivity graphene Josephson junction detector (particularly the large-scale graphene Josephson junction array detector). Hence, to research the large-scale graphene Josephson junction array detector, it is desired to develop a low-noise readout technology with a relatively simple structure, a strong interference resistance, and a high readout multiplexing ratio.

SUMMARY

In view of defects in the prior art, the present disclosure provides a terahertz graphene Josephson junction detection system based on readout of a microwave resonant circuit. With readout of a microwave resonant circuit for replacing conventional DC-biased readout, the present disclosure reads out a terahertz graphene Josephson junction detector. The graphene Josephson junction detector can be equivalent to a microwave inductance. The graphene Josephson junction detector and the microwave resonant readout circuit (equivalent to the microwave inductance and the microwave capacitance) form a microwave resonant circuit. Under radiation of a terahertz signal, the equivalent microwave inductance of the graphene Josephson junction detector is changed. As a result, a resonant frequency and a quality factor of the microwave resonant circuit are changed. A microwave network analyzer is configured to monitor the resonant frequency and the quality factor of the microwave resonant circuit, thereby realizing high-sensitivity detection on the terahertz signal. The microwave resonant readout circuit only includes an inductor and two capacitors with a coplanar waveguide structure or a microstrip structure. Compared with conventional DC-biased readout (such as SQUID readout), the present disclosure has a relatively simple structure and a low requirement on a preparation process. An output terminal of the graphene Josephson junction detector is generally a coplanar waveguide structure. The microwave resonant readout circuit and the graphene Josephson junction detector can be integrated monolithically. This further simplifies the structure in the terahertz graphene Josephson junction detection system based on readout of a microwave resonant circuit, and is more prone to realize a large-scale graphene Josephson junction array detector. In addition, the microwave resonant readout circuit is composed of the passive inductor and the passive capacitors, and is not sensitive to an external magnetic field or an electromagnetic interference. This expands an application range of the terahertz graphene Josephson junction detection system based on readout of a microwave resonant circuit. The microwave resonant readout circuit works at the microwave band (a GHz band), without an influence from a low-frequency 1/f noise. This can realize low-noise readout. Therefore, the readout of the microwave resonant circuit is a low-noise readout technology with a relatively simple structure, a strong interference resistance and a high multiplexing ratio.

To achieve the above objective, the present disclosure adopts following technical solutions:

A terahertz graphene Josephson junction detection system based on readout of a microwave resonant circuit includes a graphene Josephson junction detector, a microwave resonant readout circuit, a microwave network analyzer, and a low temperature refrigerator, where the graphene Josephson junction detector is electrically connected to the microwave resonant readout circuit to form a microwave resonant circuit; the graphene Josephson junction detector is heated by a signal to be detected, and by changing an equivalent microwave inductance of the graphene Josephson junction detector, a resonant frequency and a quality factor of the microwave resonant circuit are changed; the microwave network analyzer is connected to the microwave resonant readout circuit, and configured to monitor the resonant frequency and the quality factor of the microwave resonant circuit, thereby realizing detection on the signal to be detected; and the low temperature refrigerator provides a low temperature working environment for the graphene Josephson junction detector and the microwave resonant readout circuit.

In order to optimize the technical solution, the following specific measures are also used.

Further, the graphene Josephson junction detector is composed of a silicon lens and a graphene Josephson junction detector chip, the graphene Josephson junction detector chip is composed of a planar antenna and a graphene microbridge, and the signal to be detected is coupled to the graphene microbridge through the silicon lens and the planar antenna.

Further, the planar antenna is made of a superconducting material, and the planar antenna serves as a superconducting electrode of the graphene microbridge, and forms a superconductor-graphene-superconductor Josephson structure with the graphene microbridge.

Further, the graphene Josephson junction detector and the microwave resonant readout circuit are integrated on a same chip.

Further, the microwave resonant readout circuit as a passive device is composed of an inductor and two capacitors with a passive coplanar waveguide structure or a microstrip structure.

Further, the microwave resonant readout circuit works at a microwave band.

The present disclosure has following beneficial effects:
1. The microwave resonant readout circuit only includes the inductor and the two capacitors with the coplanar waveguide structure or the microstrip structure. Compared with conventional DC-biased readout, such as SQUID readout, the present disclosure has a relatively simple structure and a low requirement on a preparation process.
2. The microwave resonant readout circuit and the graphene Josephson junction detector can be integrated monolithically. This further simplifies the structure in the terahertz graphene Josephson junction detection system based on readout of a microwave resonant circuit, and is more prone to realize a large-scale graphene Josephson junction array detector.
3. The microwave resonant readout circuit only includes the inductor and the two capacitors with the passive coplanar waveguide structure or the structure. This is not affected by an external magnetic field or electromagnetic interference, and has a strong interference resistance.
4. The microwave resonant readout circuit generally works at the microwave band (a GHz band), without an influence from a low-frequency 1/f noise. The terahertz graphene Josephson junction detection system based on readout of a microwave resonant circuit can realize the background limit detection sensitivity.

In the figures: 1: graphene Josephson junction detector, 2: microwave resonant readout circuit, 3: microwave network analyzer, 4: low temperature refrigerator, 5: signal to be detected, 1-1: silicon lens, 1-2: graphene Josephson junction detector chip, 1-2-1: planar antenna, and 1-2-2: graphene microbridge.

DETAILED DESCRIPTION OF THE EMBODIMENTS

The present disclosure will be described in further detail below in combination with accompanying drawings.

Figure 1:
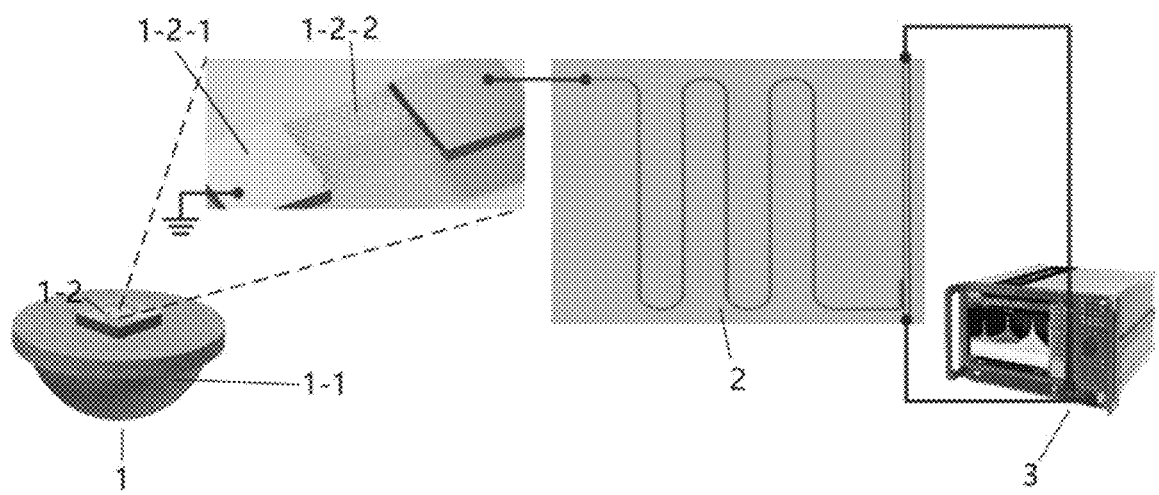
FIG. 1 is a schematic structural view of a terahertz graphene Josephson junction detection system based on readout of a microwave resonant circuit according to the present disclosure.

As shown in FIG. 1, a terahertz graphene Josephson junction detection system based on readout of a microwave resonant circuit includes graphene Josephson junction detector 1, microwave resonant readout circuit 2, and microwave network analyzer 3. The graphene Josephson junction detector 1 and the microwave resonant readout circuit 2 are electrically connected, and integrated monolithically, thereby forming a microwave resonant circuit. The microwave network analyzer 3 is connected to the microwave resonant readout circuit 2, and configured to monitor a resonant frequency and a quality factor of the microwave resonant circuit.

The graphene Josephson junction detector 1 is specifically composed of silicon lens 1-1 and graphene Josephson junction detector chip 1-2. The graphene Josephson junction detector chip 1-2 is composed of planar antenna 1-2-1 and graphene microbridge 1-2-2. A terahertz signal is coupled to the graphene microbridge 1-2-2 through the silicon lens 1-1 and the planar antenna 1-2-1.

Figure 2:
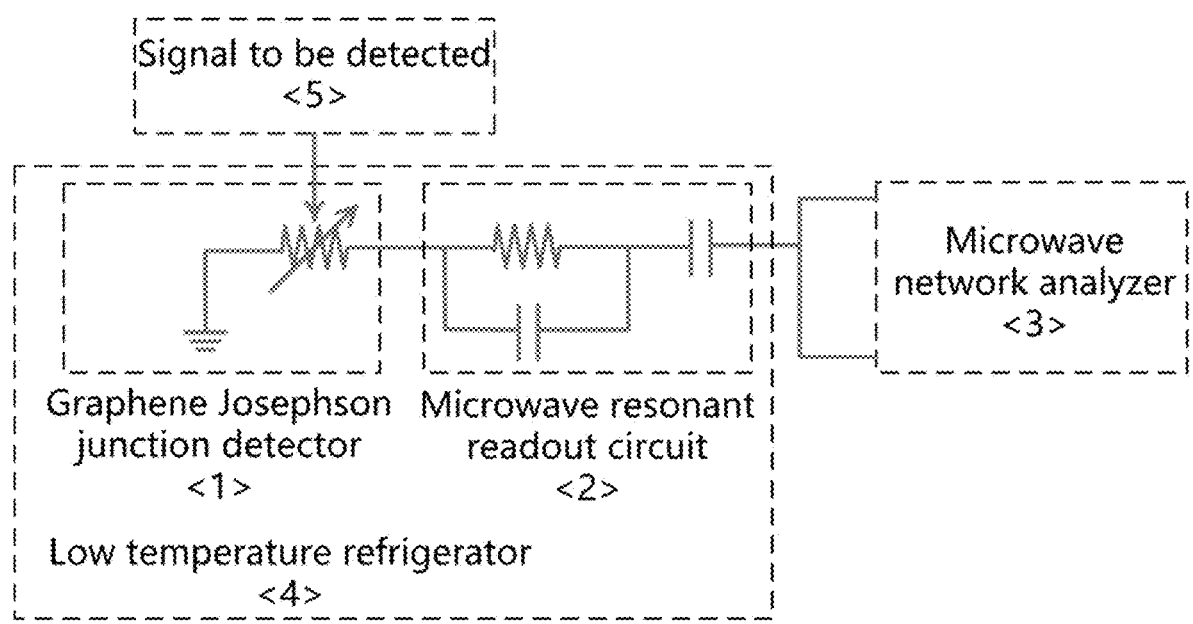
FIG. 2 illustrates a working principle of a terahertz graphene Josephson junction detection system based on readout of a microwave resonant circuit according to the present disclosure.

FIG. 2 illustrates a working principle of the terahertz graphene Josephson junction detection system based on readout of a microwave resonant circuit. Except the graphene Josephson junction detector 1, the microwave resonant readout circuit 2, and the microwave network analyzer 3, there are further low temperature refrigerator 4 and signal 5 to be detected. The low temperature refrigerator 4 provides a low temperature working environment for the graphene Josephson junction detector 1 and the microwave resonant readout circuit 2. The signal 5 to be detected is coupled to the graphene microbridge 1-2-2 through the silicon lens 1-1 and the planar antenna 1-2-1. By changing an equivalent microwave inductance of the graphene Josephson junction detector 1, the resonant frequency and the quality factor of the microwave resonant circuit formed by the graphene Josephson junction detector 1 and the microwave resonant readout circuit 2 are changed. The microwave network analyzer 3 is connected to the microwave resonant readout circuit 2, and configured to monitor the resonant frequency and the quality factor of the microwave resonant circuit, thereby realizing high-sensitivity detection on the signal 5 to be detected.

In the embodiment, the microwave resonant readout circuit 2 is composed of an inductor and two capacitors with a coplanar waveguide structure or a microstrip structure. The present disclosure has a relatively simple structure and a low requirement on a preparation process. The microwave resonant readout circuit 2 and the graphene Josephson junction detector 1 can be integrated monolithically. This is more prone to realize a large-scale graphene Josephson junction array detector. The microwave resonant readout circuit 2 as a passive device is not affected by an external magnetic field or an electromagnetic interference, and has a strong interference resistance. The microwave resonant readout circuit 2 works at the microwave band (a GHz band), without an influence from a low-frequency 1/f noise. This can realize low-noise readout. Generally, with the readout of the microwave resonant circuit for replacing conventional DC-biased readout, the present disclosure not only achieves the terahertz graphene Josephson junction detector with the background limit detection sensitivity, but also realizes the large-scale graphene Josephson junction array detector. The present disclosure is of significance to expand application of the graphene Josephson junction detector.

What is described above is merely the preferred implementations of the present disclosure, the scope of protection of the present disclosure is not limited to the above embodiments, and all technical solutions following the idea of the present disclosure fall within the scope of protection of the present disclosure. It should be noted that several modifications and adaptations made by those of ordinary skill in the art without departing from the principle of the present disclosure should fall within the scope of protection of the present disclosure.

What is claimed is:

1. A terahertz graphene Josephson junction detection system, comprising a graphene Josephson junction detector, a microwave resonant readout circuit, a microwave network analyzer, and a low temperature refrigerator, wherein the graphene Josephson junction detector is electrically connected to the microwave resonant readout circuit to form a microwave resonant circuit; the graphene Josephson junction detector is heated by a signal to be detected, and by changing an equivalent microwave inductance of the graphene Josephson junction detector, a resonant frequency and a quality factor of the microwave resonant circuit are changed; the microwave network analyzer is connected to the microwave resonant readout circuit, and configured to monitor the resonant frequency and the quality factor of the microwave resonant circuit, thereby realizing detection on the signal to be detected; and the low temperature refrigerator provides a low temperature working environment for the graphene Josephson junction detector and the microwave resonant readout circuit; wherein the graphene Josephson junction detector comprises a silicon lens and a graphene Josephson junction detector chip, the graphene Josephson junction detector chip comprises a planar antenna and a graphene microbridge, and the signal to be detected is coupled to the graphene microbridge through the silicon lens and the planar antenna; and the planar antenna is made of a superconducting material, and the planar antenna serves as a superconducting electrode of the graphene microbridge, and forms a superconductor-graphene-superconductor Josephson structure with the graphene microbridge.

2. The terahertz graphene Josephson junction detection system according to claim 1, wherein the graphene Josephson junction detector and the microwave resonant readout circuit are integrated on a same chip.

3. The terahertz graphene Josephson junction detection system according to claim 1, wherein the microwave resonant readout circuit as a passive device comprises an inductor and capacitors, and the inductor and the capacitors are configured as a passive coplanar waveguide structure or a microstrip structure.

4. The terahertz graphene Josephson junction detection system according to claim 1, wherein the microwave resonant readout circuit works at a microwave band.

* * * * *